United States Patent
Hamza et al.

(10) Patent No.: US 9,984,180 B2
(45) Date of Patent: May 29, 2018

(54) INFLOW PERFORMANCE RELATIONSHIP FOR MULTILATERAL WELLS

(71) Applicant: King Fahd University of Petroleum and Minerals, Dhahran (SA)

(72) Inventors: Ahmed Abdulazeem Hamza, Dhahran (SA); Sami Abdulaziz Alnuaim, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 459 days.

(21) Appl. No.: 14/704,507

(22) Filed: May 5, 2015

(65) Prior Publication Data
US 2016/0328497 A1 Nov. 10, 2016

(51) Int. Cl.
*G06G 7/48* (2006.01)
*G06F 17/50* (2006.01)
*E21B 43/30* (2006.01)
*E21B 41/00* (2006.01)

(52) U.S. Cl.
CPC ...... *G06F 17/5009* (2013.01); *E21B 41/0035* (2013.01); *E21B 43/305* (2013.01)

(58) Field of Classification Search
CPC .................................. G06F 17/5009
USPC .......................................... 703/10
See application file for complete search history.

(56) References Cited

U.S. PATENT DOCUMENTS 8,275,593 B2 * 9/2012 Zhao ............ E21B 49/00
703/10
8,285,532 B2 * 10/2012 Zangl ............ E21B 49/00
703/10

FOREIGN PATENT DOCUMENTS

WO WO 2014/074474 A2 5/2014

OTHER PUBLICATIONS

Ming et al.: Productivity prediction model and optimal configuration of herringbone multilateral well; J. Cent. South Univ. (2013) 20: 770-775.*
Rungtip Kamkom, "Modeling Performance of Horizontal, Undulating, and Multilateral Wells"; Dissertation for Doctor of Philosophy in Petroleum Engineering at Texas A&M University; Aug. 2007; 137 pp.
"Research on the Prediction Method of the Inflow Performance Relationship of Horizontal wells and Multi-lateral Wells" (Abstract only); Jul. 12, 2012; 2 pp.

(Continued)

*Primary Examiner* — Hugh Jones
(74) *Attorney, Agent, or Firm* — Oblon, McClelland, Maier & Neustadt, L.L.P.

(57) ABSTRACT

Described herein is an empirical model to estimate inflow performance relationship (IPR) of fishbone wells. A reservoir simulation model is formulated and initial values for a plurality of reservoir and fishbone well parameters are assigned. IPR curves are generated by simulating the formulated reservoir model for a predetermined number of iterations. Each simulation iteration has a unique value of bottom-hole flowing pressure. Sensitivity analysis is performed based on the generated IPR curves by sequentially changing the values of the plurality of fishbone well parameters. Further, regression analysis is performed based on the sensitivity analysis in order to determine an empirical model that estimates the IPR of the fishbone well. The empirical model is determined as a function of a number of multilateral branches of the fishbone well.

18 Claims, 13 Drawing Sheets

(56) References Cited

OTHER PUBLICATIONS

Siti Mariam Annuar; "Modelling Inflow Performance of Multilateral Wells by Integration of Numerical and Analytical Approach" (Abstract Only); Master's Thesis at Universiti Teknologi Petronas; 2012; 1p.

Seyed Reza Shadizadeh, et al., "Modeling of Inflow Well Performance of Multilateral Wells: Employing the Concept of Well Interference and the Joshi's Expression"; vol. 30, No. 1; 2011; Iran J. Chem. Chem. Eng.; pp. 119-133.

* cited by examiner

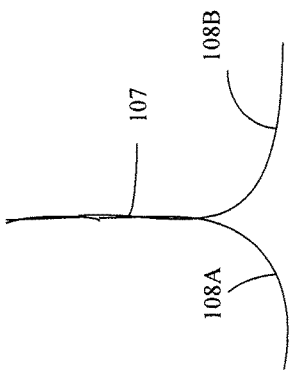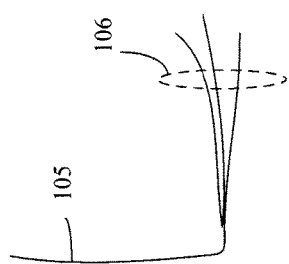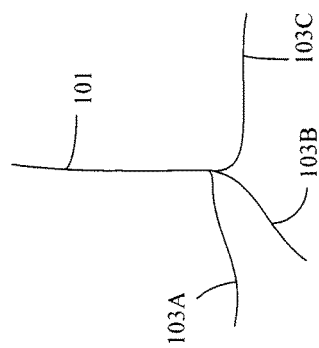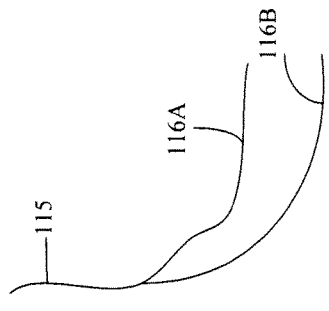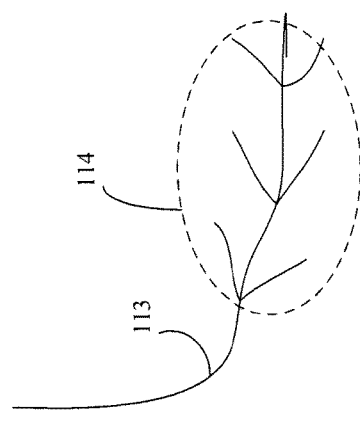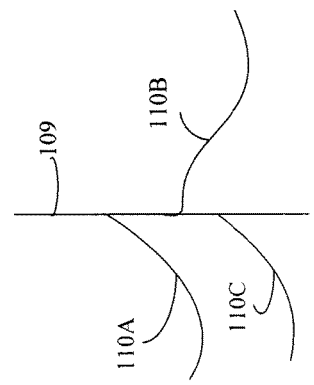

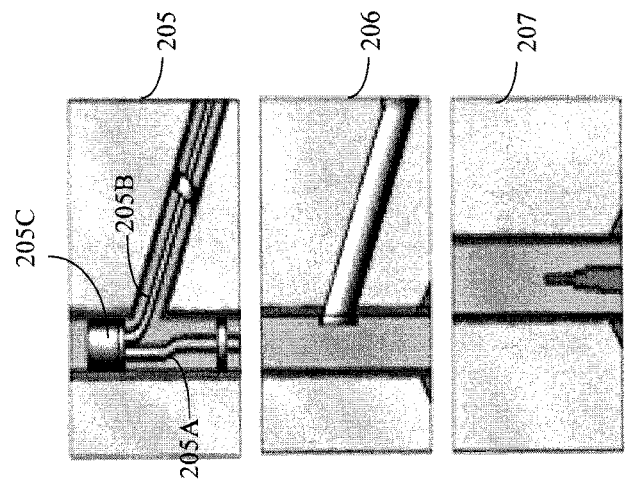
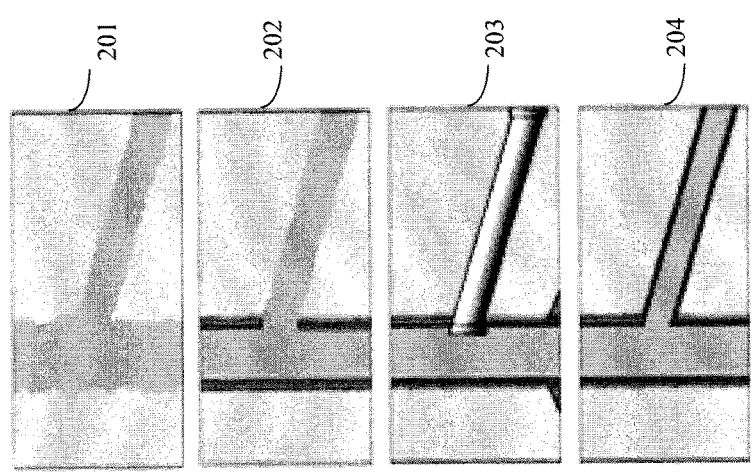
Fig. 2

INFLOW PERFORMANCE RELATIONSHIP FOR MULTILATERAL WELLS

BACKGROUND

Field of Disclosure

Embodiments described herein generally relate to formulating an empirical model for determining the inflow performance relationship of multilateral wells.

Description of the Related Art

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Multilateral wells are deployed widely by the oil and gas industries. In spite of their high cost of deployment, multilateral (or multi-branched) wells have been drilled in order to develop an effective technology that increases the amount of hydrocarbon recovery required to meet the ever-growing demand for global oil and gas. Accordingly, the productivity performance of such multilateral wells is important.

In the work conducted by Vogel in "Inflow Performance Relationships for Solution-Gas Drive Wells", JPT 20 (1), 83-92, and incorporated herein by reference in its entirety, equations are developed that can be used for analyzing the Inflow Performance Relationship (IPR) for wells drilled in solution gas driven reservoirs. However, the model developed by Vogel is applicable only for vertical wells and is not suitable (due to complexity issues) for wells having fishbone (multi-branched) architecture. Further, generalized Vogel equations are commonly used to analyze the IPR for fishbone wells when these wells are producing below bubble point pressure. However, the generalized model developed by Vogel completely ignores the number of lateral branches (also referred to as rib-holes) and the effect of the rib-holes on the IPR of the wells.

Raghavan et al. in "Productivity of multiple drain-holes or fractured horizontal wells", SPE Formation Evaluation 10 (1):11-16, 1993, and incorporated herein by reference in its entirety, developed a model based on the effective wellbore radius concept, wherein the fluid flow regime between the rib hole was assumed to be horizontally oriented. Larsen in "Productivity computations for multilateral, branched and other generalized and extended well concepts", SPE 36754, presented at the SPE Annual Technical Conference & Exhibition held in Denver 6-9 Oct. 1996, and incorporated herein by reference in its entirety, described a pseudo-radial skin computation procedure in order to estimate the productivity of multi-branched wells.

Retnanto et al. in "Performance of Multiple Horizontal Well Laterals in Low-to-Medium-Permeability reservoirs", SPE Reservoir Engineering 11 (2): 73-77, 1996, and incorporated herein in its entirety, described a semi-analytical pseudo steady state well productivity formula for multilaterals wells by coupling a linear flow (1D) model and a radial flow (2D) model in the drainage area. Further, Salas et al. in "Multilateral Well Performance", SPE 35711 presented at Western Regional Meeting held in Anchorage, Ak., 22-24, May 1996, and incorporated herein by reference in its entirety, described numerical simulators that can be utilized to determine analytically, the inflow performance relationship for several multilateral configurations of different skin factors. The work of Salas was further improved by Yildiz in "Multilateral Horizontal Well Productivity", SPE 94223 presented at SPE Europe/EAGE Annual Conference held in Madrid, Spain, 13-16 June, and incorporated herein by reference in its entirety. Yildiz described a technique to model three-dimensional analytical solutions for multilateral/dual horizontal wells in anisotropic reservoirs.

Additionally, the work conducted by Retnanto et al. in "Inflow Performance Relationship of Horizontal and Multibranched in a Solution Gas-Drive-Reservoir", SPE 50659 presented at SPE European Petroleum Conference held in The Hague, Netherlands, 20-22 October, and incorporated herein by reference in its entirety, described a technique to compute IRP for horizontal and multi-branched wells taking into account the effect of bubble-point pressures. Furthermore, Guo et al. describe in "Well Productivity Hand Book", Gulf Publishing Company, Houston, Tex. 226-230, which is incorporated herein by reference in its entirety, a model that combines several flow regimes such as vertical radial flow, reservoir radial flow and reservoir linear flow.

A drawback of the above stated works is that the respective models estimate the productivity of the oil wells without considering the effect of the number of rib-holes (i.e., lateral branches) of the fishbone wells. Accordingly, there is a requirement to develop an empirical model that estimates the IPR of fishbone wells produced from two-phase saturated reservoirs (i.e., when reservoir pressure is below bubble point pressure) by taking into account the number of rib-holes of the fishbone well.

SUMMARY

The present disclosure describes a reservoir model for determining inflow performance relationship (IPR) of fishbone wells. IPR is a tool used to assess well performance by plotting the well production rate (for instance oil production) against the flowing bottom-hole reservoir pressure. Furthermore, the present disclosure also describes a computer-implemented method for determining inflow performance of fishbone well. According to an embodiment, dimensionless IPR curves are generated by plotting bottom-hole flowing pressure versus oil production rate. The effect of several reservoir and fluids properties of fishbone wells such as initial water-saturation, porosity, permeability and oil API gravity are analyzed. The empirical model developed by the present disclosure includes the number of rib-holes parameter of the fishbone well and analyses the effect of the number of rib-holes on the performance of the fishbone well.

Accordingly an embodiment of the present disclosure provides a method of operating a computer system to determine an empirical model to estimate inflow performance relationship (IPR) of a fishbone well. The method includes formulating a reservoir simulation model that includes the fishbone well and assigning initial values for a plurality of reservoir and fishbone well parameters; generating IPR curves by simulating the formulated reservoir model for a predetermined number of iterations, wherein each iteration has a unique value of bottom-hole flowing pressure; performing sensitivity analysis based on the generated IPR curves by sequentially changing the values of the plurality of fishbone well parameters; and performing regression analysis based on the sensitivity analysis to determine an empirical model that estimates the IPR of the fishbone well, wherein the empirical model is determined as a function of a number of multilateral branches of the fishbone well.

According to one embodiment of the disclosure is provided a non-transitory computer readable medium having stored thereon a program that when executed by a computer causes the computer to execute a method to determine an empirical model to estimate inflow performance relationship (IPR) of a fishbone well. The method includes formulating a reservoir simulation model that includes the fishbone well and assigning initial values for a plurality of reservoir and fishbone well parameters; generating IPR curves by simulating the formulated reservoir model for a predetermined number of iterations, wherein each iteration has a unique value of bottom-hole flowing pressure; performing sensitivity analysis based on the generated IPR curves by sequentially changing the values of the plurality of fishbone well parameters; and performing regression analysis based on the sensitivity analysis to determine an empirical model that estimates the IPR of the fishbone well, wherein the empirical model is determined as a function of a number of multilateral branches of the fishbone well.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

Various embodiments of this disclosure that are proposed as examples will be described in detail with reference to the following figures, wherein like numerals reference like elements, and wherein:

FIGS. 1A-1F illustrate according to an embodiment, different types of multilateral wells;

FIG. 2 illustrates according to an embodiment, a classification of multilateral wells based on the complexity of the junctions of the well;

DETAILED DESCRIPTION OF EMBODIMENTS

Figure 3:
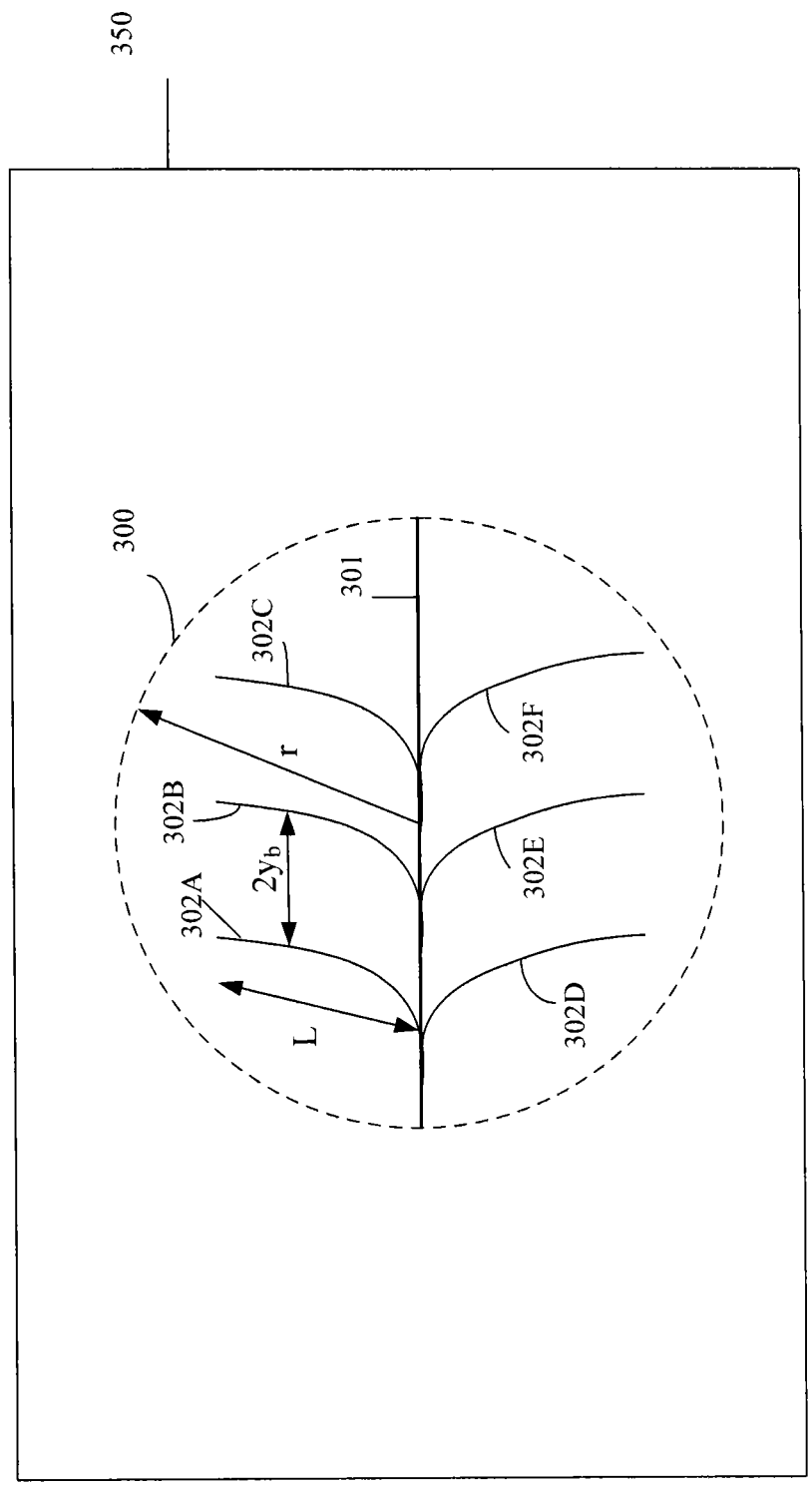
FIG. 3 depicts an exemplary horizontal fishbone well.

Fishbone wells are a new evolution of multi-lateral wells in which several wellbore branches radiate from a main horizontal borehole of the well. Multilateral oil wells are deployed to access the difficult geological formations of unconventional reservoirs. Multilateral oil wells (also referred to herein as multiple-branched horizontal wells) have many advantages as compared to conventional horizontal wells, such as fast depletion and enhanced sweep efficiency (defined herein as a measure of the effectiveness of an enhanced oil recovery process that depends on the volume of the reservoir contacted by the injected fluid). Such benefits are of tremendous value especially in water and/or gas conning problems (i.e., a production problem in which gas or bottom water infiltrates the perforation zone in the near well-bore area of the well, thereby reducing oil production).

Moreover, larger drainage area and high single well production rate can be obtained using fishbone wells. Fishbone shaped multilateral wells have better productivity than multi-fractured horizontal wells in areas of relatively low permeability. According to one embodiment of the present disclosure, a multilateral well is defined as a well with multiple branches in a lower borehole targeting the pay zone in the same layer or different layers. Multilateral wells can be classified generically as one of a root well, wherein the main well-bore is vertical and a fishbone well wherein the lateral branches exude from a horizontal wellbore.

FIG. 1A to FIG. 1F illustrate according to an embodiment, different types of multilateral wells. FIG. 1A illustrates a multi-branched well, which includes a main vertical well bore 101 and three branches 103A-103C that protrude from the main well-bore 101. FIG. 1B illustrates a forked-multilateral well that includes a main vertical well bore 105 and three branches (depicted as 106) and shaped like fork that extend in a horizontal fashion. FIG. 1C depicts a dual-opposing lateral well that includes a main vertical well-bore 107 and two lateral branches 108A and 108B that extend symmetrically in opposite direction from an end-point of the vertical well-bore 107.

FIG. 1D illustrates a multilateral well that includes a vertical well-bore 109 and branches 110A-110C that protrude in a horizontal fashion from different points along the length of the vertical well-bore 109. FIG. 1E illustrates a fishbone well that includes a main bore 113 and a plurality of lateral branches (denoted as 114) that extend outwards from the main bore 113. Note that the shape of the lateral branches along with the main well bore resembles the skeleton of a fish. FIG. 1F illustrates a stacked (planar) lateral well that includes a main well-bore 115 and lateral branches 116A and 116B that are stacked one on top of the other.

FIG. 2 illustrates according to an embodiment, a classification of multilateral wells based on the complexity of the junctions of the well. FIG. 2 depicts seven types of multilateral wells 201-207 that differ from each other based on the complexity of the junctions. A multilateral well of type-1 is depicted in 201. Such a multilateral well is an open-hole completed multilateral well that does not include any casing or cement around the vertical well-bore as well as the lateral branch. The multilateral well depicted in 202 (type-2 multilateral well) includes a casing (and/or cement) only around the vertical well-bore. The lateral branch does not include any casing or cement.

The multilateral well depicted in 203 is a multilateral well of type-3, wherein the main vertical bore is cased and cemented and the lateral branch is only cased but not cemented. In contrast, the multilateral well depicted in 204 is a multilateral well of type-4, wherein both the vertical well-bore as well as the lateral branch are cemented and cased at the junction. In the multilateral well of 204, the cemented lateral branch provides mechanical support, but the cement does not provide pressure integrity for the junction.

The multilateral well depicted in 205 (type-5 multilateral well) is similar to the multilateral well of 204 in that both the vertical well-bore and the lateral branch are cased and cemented, which offers the same level of mechanical integrity as that of the multilateral well 204. However, the difference is that pressure integrity is achieved by using tubing strings and packers to isolate the junction. Single-string packers (205A and 205B) are placed in both the main bore and lateral below the junction and connected by tubing strings to a dual-string isolation packer (205C) located above the junction in the main bore. The multilateral well 205 provides full access to both the main bore and the lateral. The multilateral well depicted in 206 is a type-6 multilateral well wherein, both mechanical and pressure integrity are achieved by using the casing to seal the junction. According to one embodiment, the level-6 multilateral well uses a pre-manufactured junction. In one instance of a type-6 multilateral well, the junction is a reformed downhole. In another instance, two separate wells are drilled out of a single main bore, and the pre-manufactured junction can be assembled downhole.

The multilateral well depicted in 207 is a type-7 multilateral well wherein, a downhole splitter (i.e., subsurface dual casing wellhead) divides the large vertical well-bore into two equal size lateral branches. Note that the type-7 multilateral well 207 is not restricted to using only a single splitter, but rather may include a plurality of splitters that bifurcate the vertical well bore into a plurality of lateral branches.

FIG. 3 depicts according to an embodiment, a schematic representation of a section of a horizontal fishbone well 300 included in a reservoir 350. The reservoir 350 has a reservoir pressure $\bar{p}$. The fishbone well 300 is disposed in a circular region of the reservoir having a radius of r and includes a main horizontal well-bore 301 and six lateral branches 302A-302F. For sake of simplicity, each of the lateral branches 302A-302F is of length L and the spacing between the lateral branches is a constant denoted by $2y_b$.

Figure 4:
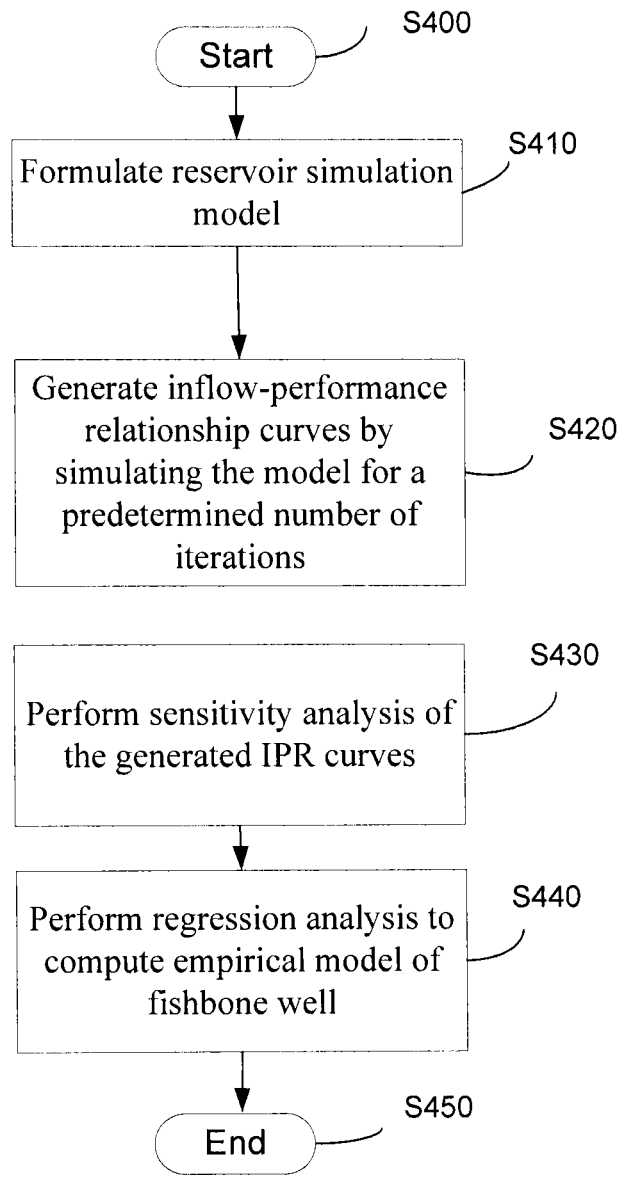
FIG. 4 depicts according to an embodiment, an exemplary flowchart illustrating the steps performed in order to determine an empirical model of the fishbone well of FIG. 3.

FIG. 4 depicts according to an embodiment, an exemplary flowchart illustrating the steps performed in order to determine an empirical model for the fishbone well of FIG. 3. The empirical model determined by the process of FIG. 4 is referred to herein as Abdulazeem and Al-Nuaim (A&A) model. The A&A model estimates the IPR of fishbone wells as a function of the number of rib-holes (i.e., lateral branches) of the fishbone well.

The process starts in step S400 and proceeds to step S410. In step S410, a commercial simulator is used to formulate (model) a solution gas driven reservoir that includes a reference multilateral fishbone well. According to one embodiment, a commercial simulator can be used to model the reservoir. A single fishbone multilateral well is placed in the reservoir and simulated for different numbers of rib-holes ranging from 2 to 14 that radiate from the main horizontal wellbore. The number of grid-cells in the simulation model is set as 61, 21 and 11 cells in x, y and z-direction respectively. The well is positioned at coordinates (x=1, y=11).

According to one embodiment, the fishbone well is assumed to have the following properties for purposes of simulation: (1) all the horizontal branches (rib-holes) are evenly radiated from the horizontal well bore and have the same length denoted by L. The spacing between the rib-holes is assumed to be constant and is denoted as $2y_b$, wherein $y_b$ is the half-width spacing between the rib-holes. Furthermore, the reservoir model in the simulation is of a box shape having a constant thickness of 750 ft. The porous media within the reservoir has a porosity of 0.1 and anisotropic permeability in the x, y, and z directions of 10, 10 and 1md, respectively. A constant initial water saturation of 0.14 was assigned to all simulation runs (cases) and the bubble point pressure was set to 5000 psi. A base case is first simulated using the properties of black oil as shown in Table I.

TABLE I reservoir fluid properties.

| Bottom hole pressure (P) psi | Gas-Oil Ratio (Rs) mcf/STB | Oil Formation Volume Factor (Bo) bbl/STB | Oil Viscosity ($\mu_o$) cp |
|---|---|---|---|
| 500 | 0.054 | 1.045 | 1.6667 |
| 714.286 | 0.0558333 | 1.0474 | 1.3725 |
| 1428.57 | 0.125625 | 1.08002 | 1.1684 |
| 2142.86 | 0.215357 | 1.124 | 1.0193 |
| 2857.14 | 0.335 | 1.18504 | 0.9059 |
| 3571.43 | 0.5025 | 1.27335 | 0.8188 |
| 4285.71 | 0.75375 | 1.4094 | 0.7451 |
| 4642.86 | 0.933214 | 1.50811 | 0.430698 |
| 5000 | 1.1725 | 1.64093 | 0.177561 |

Upon formulating the simulation model in step S410, the process proceeds to step S420, wherein dimensionless inflow performance relationship curves are generated by plotting the oil flow rate against bottom-hole pressure. The base data (i.e., reservoir data and fishbone well data) used to develop IPR curves is depicted in Tables II and III. For sake of simplicity, the effect of capillary pressure and non-Darcy flow are neglected. The nomenclature for the parameters used in the present disclosure are described in Table IV.

TABLE II

Reservoir data

| Variable | Base case value | Unit |
|---|---|---|
| Reservoir X-coordinate | 20000 | ft |
| Reservoir Y-coordinate | 10000 | ft |
| Reservoir Z-coordinate | 750 | ft |
| Permeability in X-direction | 10 | mD. |
| Permeability in Y-direction | 10 | mD |
| Permeability in Z-direction | 1 | mD |
| Porosity | 10 | % |
| Bubble point pressure | 5000 | psi |
| Initial water saturation | 14 | % |
| Critical gas saturation | 0 | % |
| Residual oil saturation | 14 | % |
| Oil density | 54.637 | lbm/ft3 |
| Gas density | 0.068432 | lbm/ft3 |
| Water density | 62.4 | lbm/ft3 |

TABLE III

Fishbone well data

| Variable | Base case value | Unit |
|---|---|---|
| $2y_b$ | 1290 | ft |
| L | 476 | ft |
| n | 8 | |
| d | 0.3 | ft |

TABLE IV description of parameters

| Parameter | Description |
|---|---|
| $k_H$ | horizontal permeability, md |
| $k_P$ | vertical permeability, md |
| P | average reservoir pressure, psi |
| $P_{PL}$ | Pressure at the "interface" between the outer and the inner regions in the fishbone well-penetrated reservoir, psi |
| $P_{wf}$ | flowing bottom hole pressure, psi |
| $q_o$ | oil production rate, stb/d |
| $q_{o_{max}}$ | maximum oil well production rate, stb/d |
| r | Radius of the interface between the outer and the inner regions in the fishbone well penetrated reservoir, ft |
| $y_b$ | rib hole half-spacing, ft |
| L | Rib hole length, ft. |
| n | number of rib holes. |
| Rs | solution gas oil ratio, mcf/STB |
| Bo | oil formation volume factor, bbl/STB |
| $\mu_o$ | oil viscosity, cp. |
| d | Tubing inner diameter, ft. |

According to one embodiment, a small time-step is applied at the beginning of each simulation run to model the initial stage of well production. The simulation runs are performed starting from an initial reservoir pressure that is less than the bubble point pressure. For each simulation, different values of bottom-hole flowing pressures are used. Further, dimensionless IPR curves are generated by dividing the bottom-hole pressure of each iteration (simulation run) by the average reservoir pressure and the oil production rate by absolute open flow (AOF) (the maximum rate, corresponding to 100% drawdown). IPR curves were generated in dimensionless form to compare the rate of shifting of each curve when changing some parameters.

According to one embodiment, the simulation model was run in two different fashions. Firstly, a constant bottom-hole flowing pressure was specified. Secondly, the well was constrained by a constant oil production rate. Constant bottom-hole pressure constraint runs provided better IPR curves than the IPR curves obtained by assuming a constant flow rate. Thus, by one embodiment, constant bottom-hole pressure constraint was used for all simulation runs. The performance of each case was simulated using ten different values of bottom-hole flowing pressure as shown in Table V.

TABLE V

Bottom hole flowing pressure for simulation iterations.

| Simulation Iteration No. | Bottom-hole flowing pressure Pounds per square inch (psi) |
|---|---|
| 1 | 14.7 |
| 2 | 400 |
| 3 | 800 |
| 4 | 1200 |
| 5 | 1600 |
| 6 | 2000 |
| 7 | 2400 |
| 8 | 2800 |
| 9 | 3200 |
| 10 | 3600 |

Upon generating the IPR curves in step S420, the process proceeds to step S430. According to one embodiment, in step S430 sensitivity analysis of a plurality of well parameters is performed to determine the effect of the parameter on the performance of well. Specifically, sensitivity analysis is a form of simulation analysis in which key quantitative assumptions and computations (i.e., underlying system parameters) are changed systematically to assess their effect on the final outcome (well performance). According to one embodiment, the fishbone well parameters such as initial water saturation, American Petroleum Institute gravity (API gravity) defined herein as a measure of how heavy or light a petroleum liquid is compared to water, porosity, permeability, bubble point pressure, number of rib holes and rib-hole length are sequentially changed in order to determine their respective effect on the performance of the fishbone well. Results depicting the effect of these parameters are described later with reference to FIGS. 5-11.

Upon performing the sensitivity analysis, the process proceeds to step S440, wherein based on the sensitivity analysis performed in step S430, regression analysis is performed in order to generate an empirical model that estimates IPR of fishbone wells as a function of the number of lateral branches in the well. Regression analysis is an approach to model the relationship between scalar dependent variables and one or more explanatory (i.e., independent) variables. According to one embodiment, the empirical model for fishbone oil wells is computed as:

$$\frac{q_o}{q_{o max}} = 1 - (0.0446*n + 0.1488)\left(\frac{P_{wf}}{P_r}\right) - (0.8288 - 0.0358*n)\left(\frac{P_{wf}}{P_r}\right)^2 \quad (1)$$

wherein, $q_o$ is an oil flow rate, $q_{o,max}$ is a maximum oil flow rate, $P_r$ is average reservoir pressure, $P_{wf}$ is bottom-hole pressure and n corresponds to the number of lateral branches (rib-holes) radiating from the horizontal well-bore of the fishbone well. Upon computing the empirical model for the fishbone well, the process terminates in step S450.

In what follows, the sensitivity analysis of the fishbone well is described in detail. FIGS. 5-11 depict exemplary graphs depicting the influence of each individual parameter on the IPR of fishbone wells. According to one embodiment, the fishbone well parameters considered are porosity, initial water saturation, API effect, bubble point pressure, permeability, rib-hole length, and number of rib-holes of the fishbone well.

Figure 5:
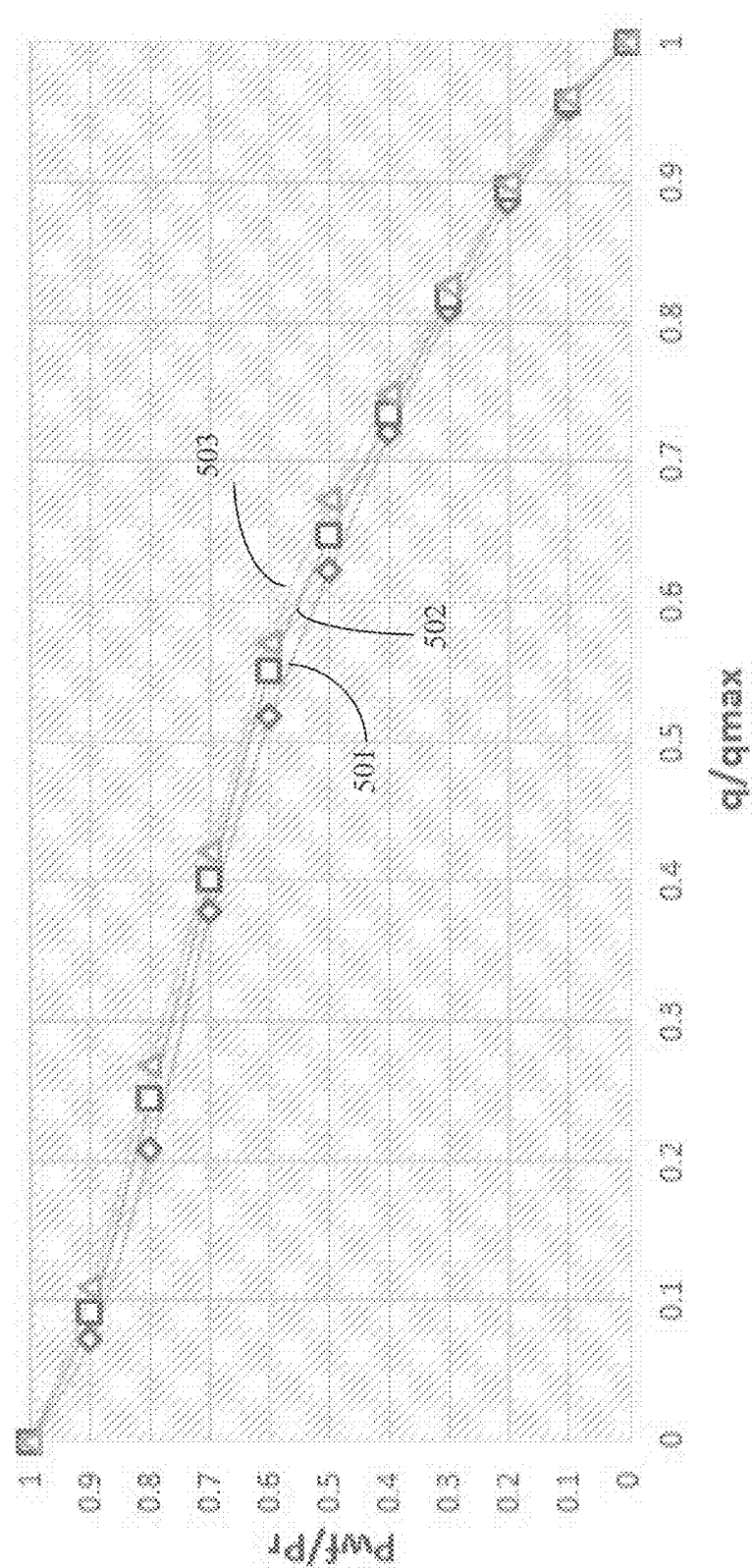
FIG. 5 illustrates an exemplary graph depicting the influence of the porosity parameter on the IPR of fishbone well.

FIG. 5 depicts a graph illustrating the performance of varying the porosity of the well on the IPR of the fishbone well. The graph in FIG. 5 includes bottom-hole pressure normalized to the average reservoir pressure being plotted on the Y-axis, and the normalized oil flow rate being plotted on the X-axis. The curves 501, 502, and 503 correspond to values of porosity being 0.1, 0.15, and 0.2, respectively. It can be observed from the graph of FIG. 5, that changing the values of the porosity of well do not impact the IPR of the fishbone well considerably. Specifically, varying the values of porosity causes negligible impact on the performance of the fishbone well.

Figure 6:
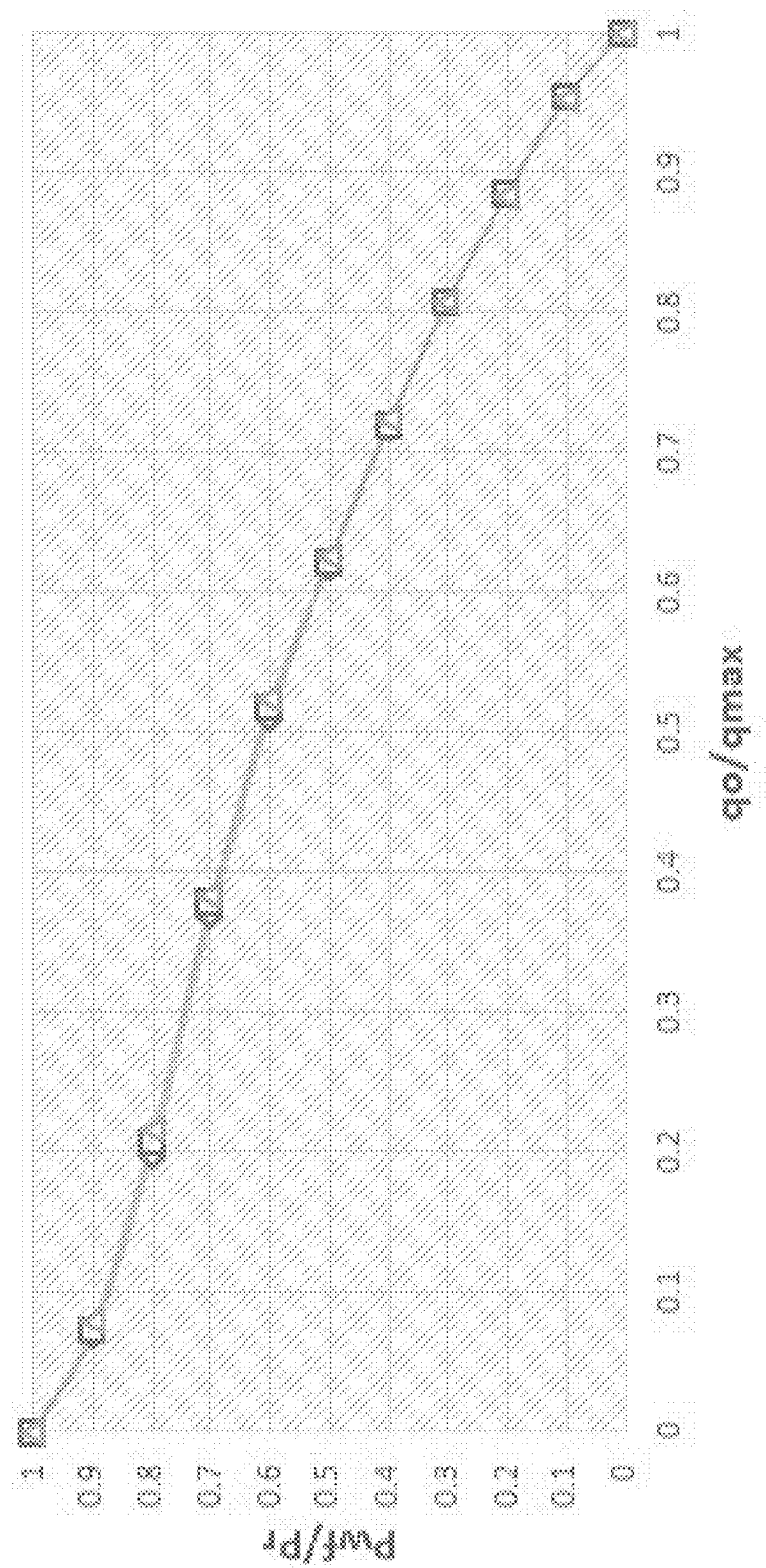
FIG. 6 illustrates an exemplary graph depicting the influence of the initial water saturation on the IPR of fishbone well.
Figure 7:
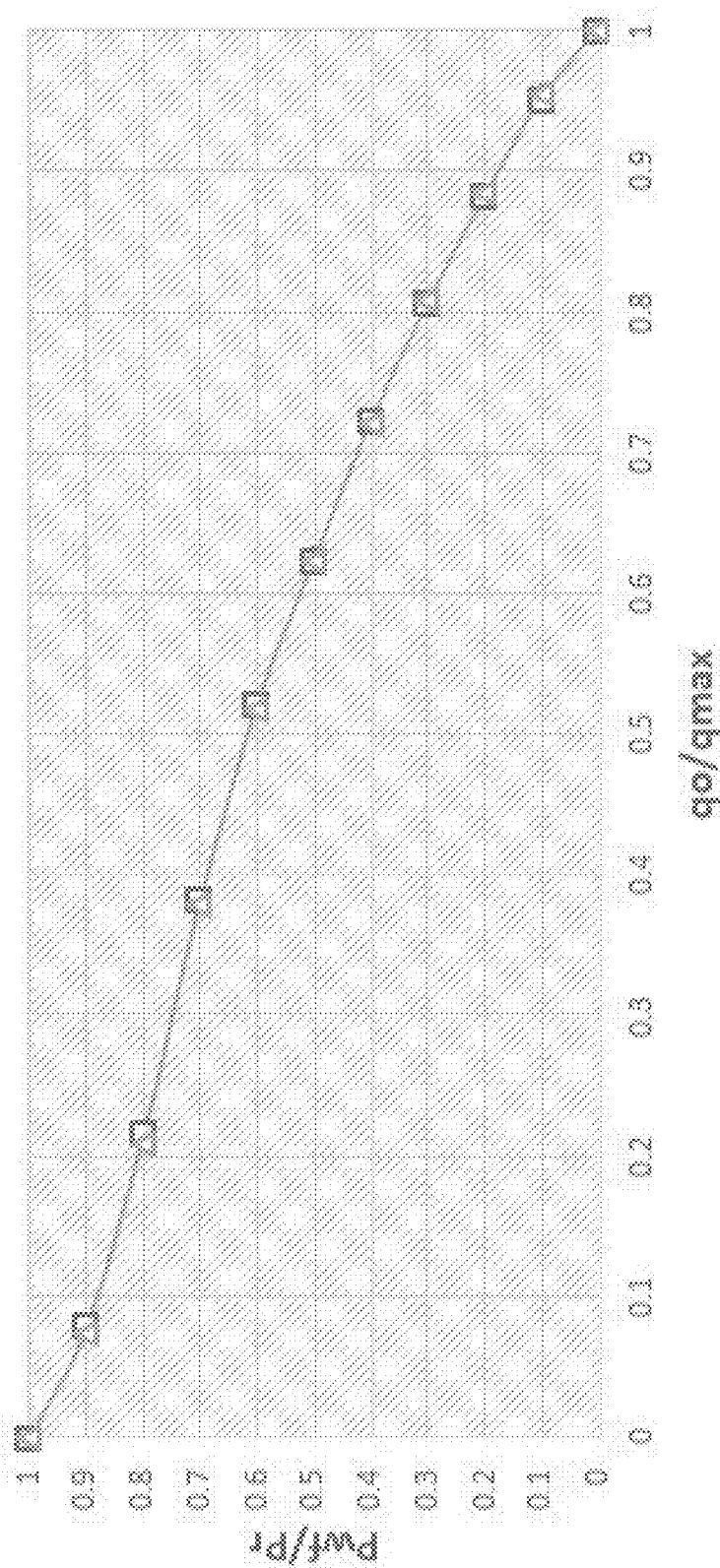
FIG. 7 illustrates an exemplary graph depicting the influence of the API parameter on the IPR of fishbone well.
Figure 8:
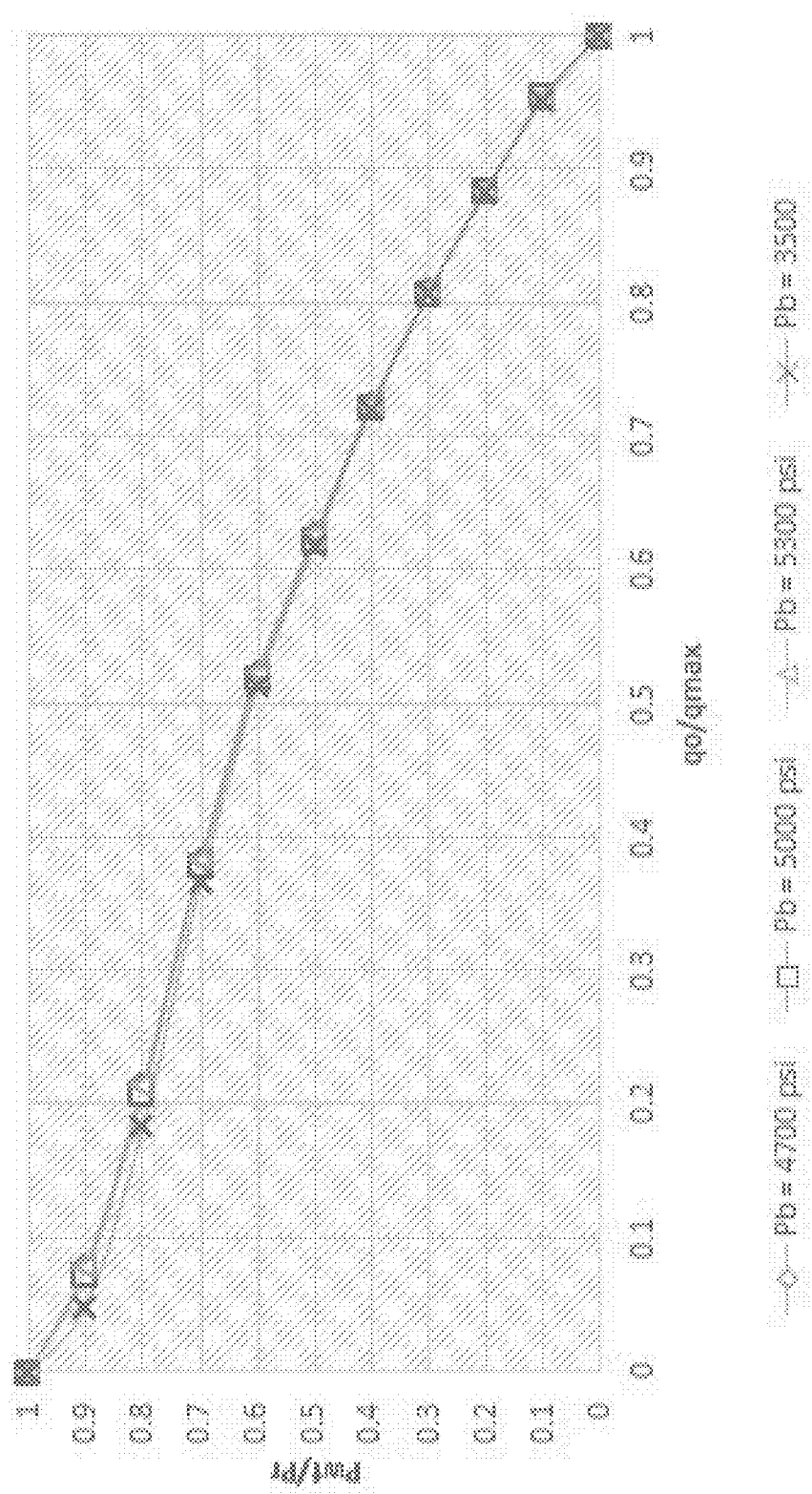
FIG. 8 illustrates an exemplary graph depicting the influence of bubble point pressure parameter on the IPR of fishbone well.

FIG. 6 illustrates an exemplary graph depicting the influence of the initial water saturation parameter on the IPR of the fishbone well. For values of initial water saturation (SWI) of 0.1, 0.14, and 0.15, the performance of the fishbone well is similar. Specifically, the curves corresponding to the above values of SWI as shown in FIG. 6 overlap one another. Similarly, as shown in FIG. 7, for values of API effect of 35, 40 and 30, the corresponding IPR curves of the fishbone well overlap one another, thereby implying that varying the API effect parameter has negligible influence on the performance of the fishbone well. Similarly, as shown in FIG. 8, varying the bubble point pressures for values of 3500, 4700, 5000 and 5300 has negligible impact on the performance of the fishbone well.

Figure 9:
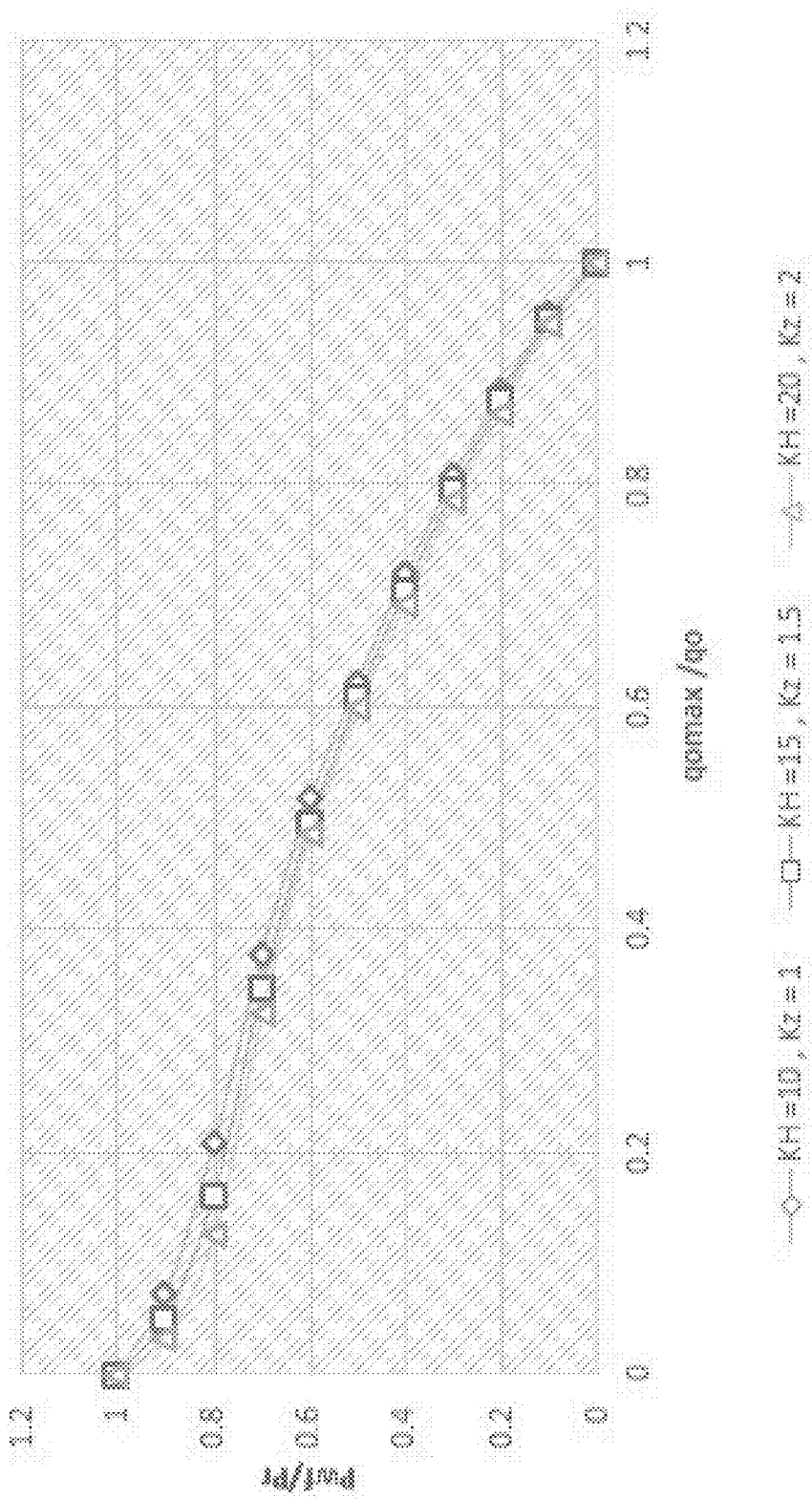
FIG. 9 illustrates an exemplary graph depicting the influence of the permeability parameter on the IPR of fishbone well.
Figure 10:
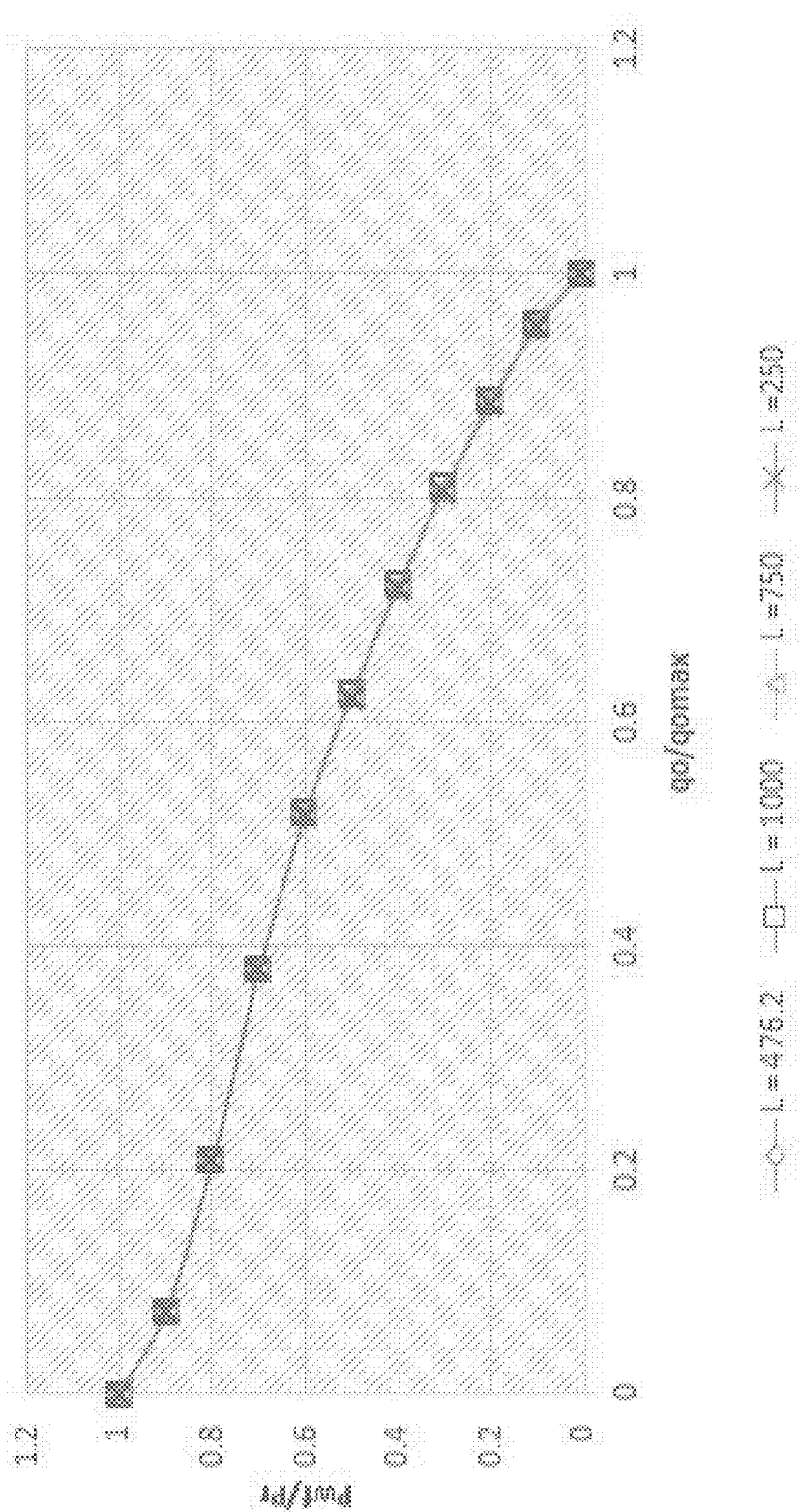
FIG. 10 illustrates an exemplary graph depicting the influence of the length of lateral branches (rib-hole length) on the IPR of fishbone well.

Furthermore, as shown in FIG. 9, by varying the permeability parameter (for values in the horizontal direction (KH) and z-axis direction (Kz)) of (KH=10, Kz=1), (KH=15, Kz=1.5), and (KH=20, Kz=2) impacts the performance of the fishbone well in a negligible fashion. Additionally, as shown in FIG. 10, by varying the length of rib-hole parameter (L) from L=250, 476.2, 750, and 1000, results in similar performance of the fishbone well. Accordingly, according to one embodiment of the disclosure, the parameters porosity, permeability, bubble-point pressure, initial water saturation, API gravity, and rib-hole length do not affect performance of the fishbone well considerably.

Figure 11A:
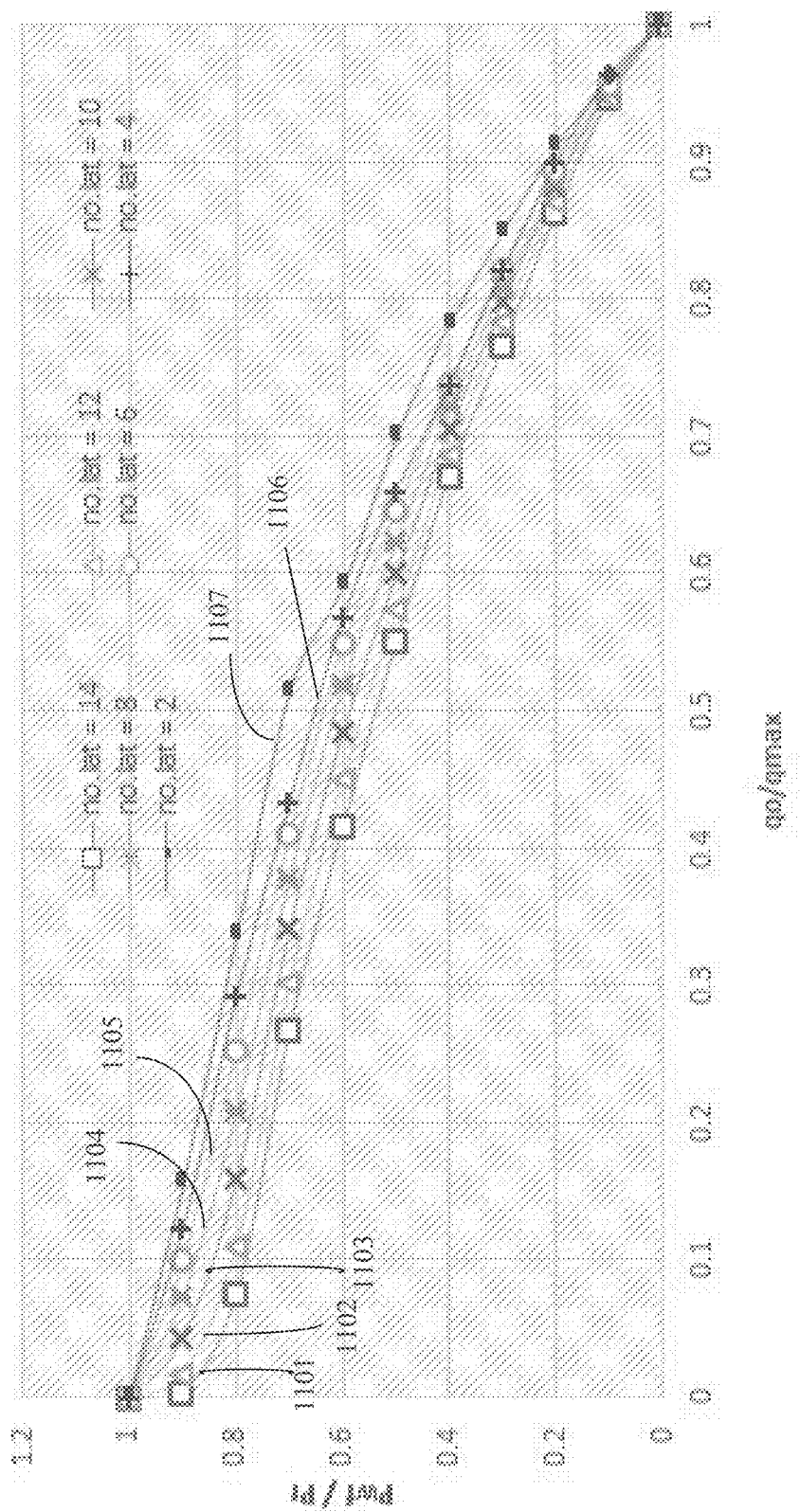
FIG. 11A illustrates an exemplary graph depicting the influence of the number of rib-holes on the IPR of fishbone well and FIG. 11B illustrates a graph depicting a comparison between the A&A model of the present disclosure and a Vogel model.

In contrast, as shown in FIG. 11A, varying the number of rib-holes (lateral branches of the fishbone well) affects the performance of the fishbone well considerably. As shown in FIG. 11A, the performance of the fishbone well is computed by varying the number of rib-holes. According to one embodiment, the numbers of rib-holes are varied from 2 to 14. The curves in FIG. 11A correspond to each simulation iteration with a fixed number of rib-holes. Specifically, curves 1101-1107 in FIG. 11A correspond to number of rib-holes being 14, 12, 10, 8, 6, 4, and 2. It can be observed from the graph in FIG. 11A that varying the number of rib-holes impacts the performance of the fishbone well.

According to one embodiment, the empirical model obtained from the process of the FIG. 4 (i.e., A&A model) is compared with a Vogel model that is typically used to model reservoir performance when reservoir pressure is below bubble point pressure. Note that a crucial drawback of the Vogel model is that it does not account for the number of fishbone lateral branches (i.e., rib-holes). In contrast, as shown in equation (1), the A&A model incorporates the number of rib-holes parameter in the evaluation of the performance of the fishbone well. According to one embodiment, the comparison between the A&A model of the present disclosure and the Vogel model is performed for the data represented in Table VI.

TABLE VI

Reservoir data for comparing A&A model to Vogel model.

| Quantity | Value | Unit |
| --- | --- | --- |
| Rib hole spacing ($2y_b$): | 1000 | ft |
| Rib hole length (L): | 1000 | ft |
| Average rib hole skin factor (s): | 5 | |
| Oil bubblpoint pressure ($p_b$): | 5000 | psia |
| Effective horizontal permeability ($k_H$): | 10 | md |
| Pay zone thickness (h): | 50 | ft |
| Average reservoir pressure ($p_{-bar}$): | 4000 | psia |
| Oil formation volume factor ($B_o$): | 1.2 | rb/stb |
| Well drainage area (A): | 320 | acres |
| Rib hole radius ($r_w$): | 0.328 | ft |
| Vertical permeability ($k_V$): | 2 | md |
| Well vertical depth (H): | 8000 | ft |
| Tubing inner diameter (d): | 4 | in. |
| Oil gravity (API): | 30 | API |
| Oil viscosity ($\mu_o$): | 1.5 | cp |
| Producing GLR (GLR): | 500 | scf/bbl |
| Gas specific gravity ($g_g$): | 0.7 | air = 1 |
| Flowing tubing head pressure ($p_{hf}$): | 800 | psia |
| Flowing tubing head temperature ($t_{hf}$): | 150 | °F. |
| Flowing temperature at tubing shoe ($t_{wf}$): | 180 | °F. |
| Water cut (WC): | 10 | % |
| Oil-gas interfacial tension (s): | 30 | dynes/cm |
| Specific gravity of water ($g_w$): | 1.05 | |

TABLE VI-continued

Reservoir data for comparing A&A model to Vogel model.

| Quantity | Value | Unit |
| --- | --- | --- |
| Number of rib holes (n): | 7 | |
| Drainage area shape factor ($C_A$) based on aspect ratio | 5.38 | |

Figure 11B:
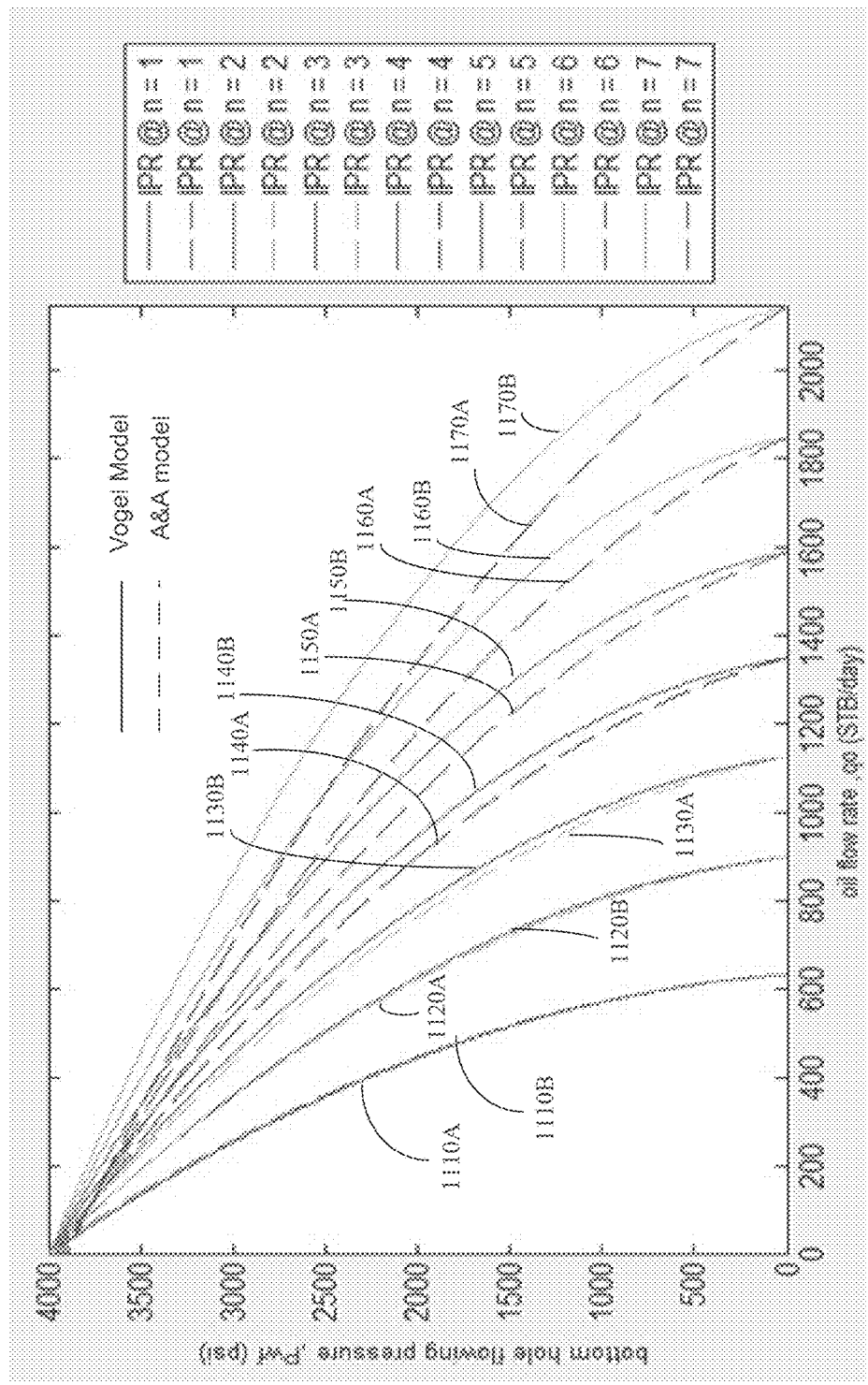

FIG. 11B illustrates according to an embodiment, a graph depicting a comparison between the A&A model of the present disclosure and a Vogel model that is typically used to model reservoir performance. In FIG. 11B, the curves 1110A-1170A correspond to the performance of the A&A model for number of rib-holes varying from n=1 to n=7, whereas the curves 1110B-1170B correspond to the performance of the Vogel model for the respective number of rib-holes. It can be observed from FIG. 11B, that for the case of having a low number of rib-holes (n=1, 2, and 3) in the fishbone well, the performance of the A&A model is similar to the performance of the Vogel model. However, when the number of rib-holes are increased (i.e., n is greater than 3), the two models demonstrate a difference in performance and thereby require a real case study to validate the accuracy.

Each of the functions of the described embodiments may be implemented by one or more processing circuits. A processing circuit includes a programmed processor (for example, processor 1203 in FIG. 12), as a processor includes circuitry. A processing circuit also includes devices such as an application-specific integrated circuit (ASIC) and conventional circuit components arranged to perform the recited functions.

Figure 12:
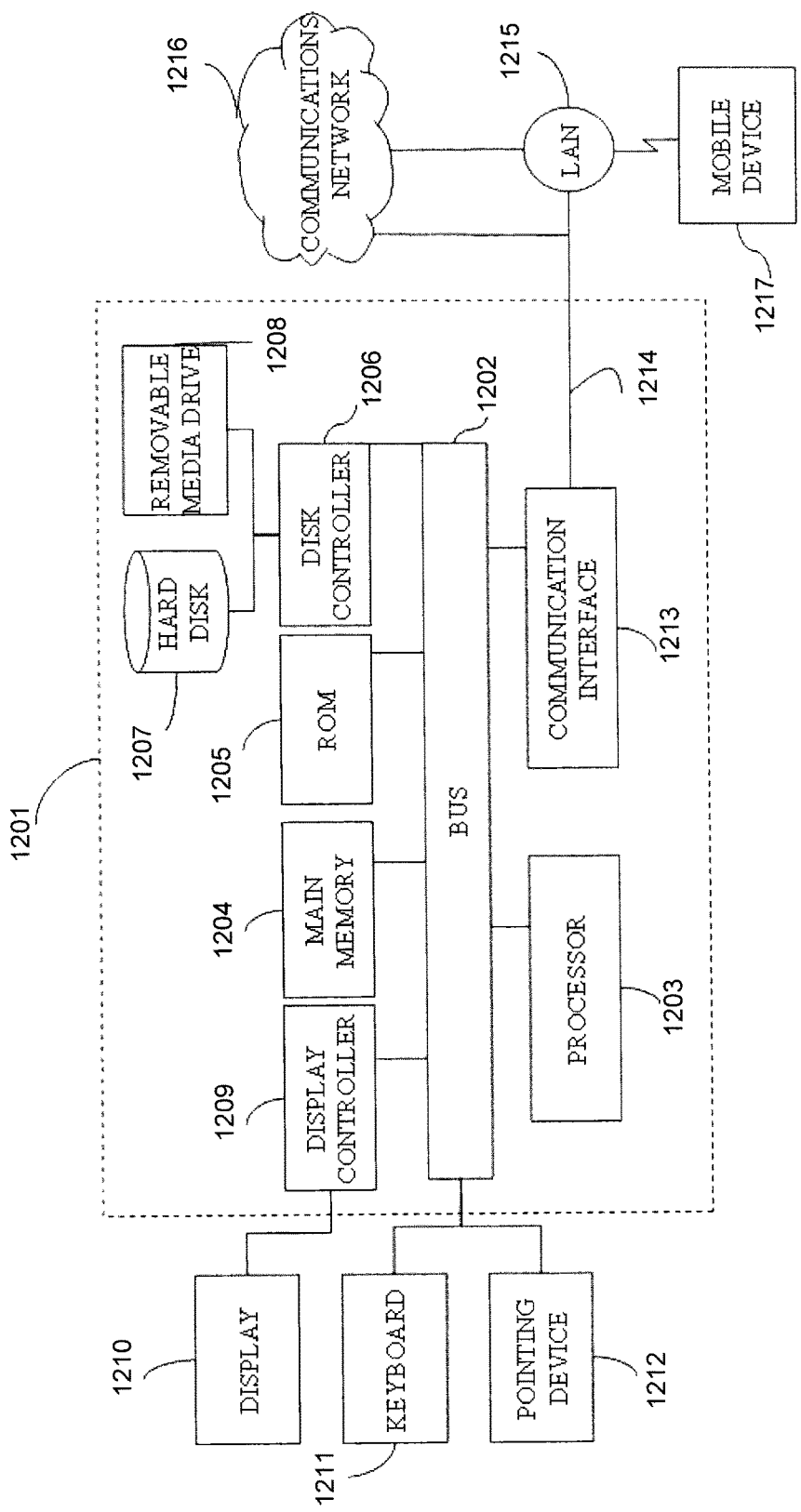
FIG. 12 illustrates a block diagram of a computing device according to an embodiment.

The various features discussed above may be implemented by a computer system (or programmable logic). FIG. 12 illustrates such a computer system 1201. According to one embodiment, the computer system may be operated to determine an empirical model that enables estimating the inflow performance relationship of fishbone wells. Furthermore, the empirical model is determined a function of the number of rib-holes (multilateral branches) of the fishbone well. In doing so, a more accurate estimation of multilateral fishbone wells is obtained as compared to typical models that are used to estimate the performance of wells. The computer system 1201 includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1201 may also include a display controller 1209 coupled to the bus 1202 to control a display 1210, for displaying information to a computer user. The computer system includes input devices, such as a keyboard 1211 and a pointing device 1212, for interacting with a computer user and providing information to the processor

1203. The pointing device 1212, for example, may be a mouse, a trackball, a finger for a touch screen sensor, or a pointing stick for communicating direction information and command selections to the processor 1203 and for controlling cursor movement on the display 1210.

The processor 1203 executes one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to any of the teachings of the present disclosure and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes.

Stored on any one or on a combination of computer readable media, the present disclosure includes software for controlling the computer system 1201, for driving a device or devices for implementing the invention, and for enabling the computer system 1201 to interact with a human user. Such software may include, but is not limited to, device drivers, operating systems, and applications software. Such computer readable media further includes the computer program product of the present disclosure for performing all or a portion (if processing is distributed) of the processing performed in implementing any portion of the invention.

The computer code devices of the present embodiments may be any interpretable or executable code mechanism, including but not limited to scripts, interpretable programs, dynamic link libraries (DLLs), Java classes, and complete executable programs. Moreover, parts of the processing of the present embodiments may be distributed for better performance, reliability, and/or cost.

The term "computer readable medium" as used herein refers to any non-transitory medium that participates in providing instructions to the processor 1203 for execution. A computer readable medium may take many forms, including but not limited to, non-volatile media or volatile media. Non-volatile media includes, for example, optical, magnetic disks, and magneto-optical disks, such as the hard disk 1207 or the removable media drive 1208. Volatile media includes dynamic memory, such as the main memory 1204. Transmission media, on the contrary, includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present disclosure remotely into a dynamic memory and send the instructions over a telephone line using a modem. A modem local to the computer system 1201 may receive the data on the telephone line and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an integrated services digital network (ISDN) card. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc.). The signals through the various networks and the signals on the network link 1214 and through the communication interface 1213, which carry the digital data to and from the computer system 1201 may be implemented in baseband signals, or carrier wave based signals.

The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214 and the communication interface 1213. Moreover, the network link 1214 may provide a connection through a LAN 1215 to a mobile device 1217 such as a personal digital assistant (PDA) laptop computer, or cellular telephone.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below. Furthermore, the above disclosure also encompasses the embodiments noted below.

The invention claimed is:

1. A method of operating a computer system to determine an empirical model to estimate inflow performance relationship (IPR) of a fishbone well, the method comprising:
formulating a reservoir simulation model that includes the fishbone well and assigning initial values for a plurality of reservoir and fishbone well parameters;
generating, by a processing circuit, IPR curves by simulating the formulated reservoir model for a predetermined number of iterations, wherein each iteration has a unique value of bottom-hole flowing pressure;
performing, by the processing circuit, sensitivity analysis based on the generated IPR curves by sequentially changing the values of the plurality of fishbone well parameters; and
performing, by the processing circuit, regression analysis based on the sensitivity analysis to determine an empirical model that estimates the IPR of the fishbone well, wherein the empirical model is determined as a function of a number of multilateral branches of the fishbone well;
deploying a fishbone well based on the empirical model.

2. The method of claim 1, wherein the multilateral branches of the fishbone well protrude from a horizontal well-bore of the fishbone well, each multilateral branch having a same predetermined length.

3. The method of claim 2, wherein a spacing between consecutive multilateral branches is constant.

4. The method of claim 3, wherein the spacing between consecutive multilateral branches is 1290 feet and the length of each multilateral branch of the fishbone well is 476 feet.

5. The method of claim 1, wherein the generating step further comprises:
simulating the formulated reservoir model for the predetermined number of iterations, each iteration having a constant oil production rate.

6. The method of claim 1, wherein the plurality of fishbone well parameters include porosity, permeability, bubble-point pressure, API gravity, number of multilateral branches, length of multilateral branches, and initial water saturation.

7. The method of claim 1, wherein the empirical model is formulated as:

$$\frac{q_o}{q_{o\,max}} = 1 - (0.0446*n + 0.1488)\left(\frac{P_{wf}}{P_r}\right) - (0.8288 - 0.0358*n)\left(\frac{P_{wf}}{P_r}\right)^2$$

and wherein, $q_o$ is an oil flow rate, $q_{o,max}$ is a maximum oil flow rate, $P_r$ is average reservoir pressure, $P_{wf}$ is bottom-hole pressure and n corresponds to the number of multilateral branches of the fishbone well.

8. The method of claim 1, wherein the generating step further comprises:
generating dimensionless IPR curves by dividing the bottom-hole pressure of each simulation iteration by an average reservoir pressure, and dividing an oil production rate by an absolute open flow.

9. The method of claim 1, wherein the number of predetermined iterations is ten and the corresponding values of the bottom-hole flowing pressures in pounds per square inch (psi) are 14.7, 400, 800, 1200, 1600, 2000, 2400, 2800, 3200, and 3600.

10. A non-transitory computer readable medium having stored thereon a program that when executed by a computer causes the computer to execute a method to determine an empirical model to estimate inflow performance relationship (IPR) of a fishbone well, the method comprising:
formulating a reservoir simulation model that includes the fishbone well and assigning initial values for a plurality of reservoir and fishbone well parameters;
generating IPR curves by simulating the formulated reservoir model for a predetermined number of iterations, wherein each iteration has a unique value of bottom-hole flowing pressure;
performing sensitivity analysis based on the generated IPR curves by sequentially changing the values of the plurality of fishbone well parameters; and
performing regression analysis based on the sensitivity analysis to determine an empirical model that estimates the IPR of the fishbone well, wherein the empirical model is determined as a function of a number of multilateral branches of the fishbone well,
wherein a fishbone well is deployed based on the empirical model.

11. The non-transitory computer readable medium of claim 10, wherein the multilateral branches of the fishbone well protrude from a horizontal well-bore of the fishbone well, each multilateral branch having a same predetermined length.

12. The non-transitory computer readable medium of claim 11, wherein a spacing between consecutive multilateral branches is constant.

13. The non-transitory computer readable medium of claim 12, wherein the spacing between consecutive multilateral branches is 1290 feet and the length of each multilateral branch of the fishbone well is 476 feet.

14. The non-transitory computer readable medium of claim 10, wherein the generating step further comprises:
simulating the formulated reservoir model for the predetermined number of iterations, each iteration having a constant oil production rate.

15. The non-transitory computer readable medium of claim 10, wherein the plurality of fishbone well parameters include porosity, permeability, bubble-point pressure, API gravity, number of multilateral branches, length of multilateral branches, and initial water saturation.

16. The non-transitory computer readable medium of claim 10, wherein the empirical model is formulated as:

$$\frac{q_o}{q_{o\,max}} = 1 - (0.0446*n + 0.1488)\left(\frac{P_{wf}}{P_r}\right) - (0.8288 - 0.0358*n)\left(\frac{P_{wf}}{P_r}\right)^2$$

and, wherein, $q_o$ is an oil flow rate, $q_{o,max}$ is a maximum oil flow rate, $P_r$ is average reservoir pressure, $P_{wf}$ is bottom-hole pressure and n corresponds to the number of multilateral branches of the fishbone well.

17. The non-transitory computer readable medium of claim 10, wherein the generating step further comprises:
generating dimensionless IPR curves by dividing the bottom-hole pressure of each simulation iteration by an average reservoir pressure, and dividing an oil production rate by an absolute open flow.

18. The non-transitory computer readable medium of claim 10, wherein the number of predetermined iterations is ten and the corresponding values of the bottom-hole flowing pressures in pounds per square inch (psi) are 14.7, 400, 800, 1200, 1600, 2000, 2400, 2800, 3200, and 3600.

* * * * *